United States Patent
Choi et al.

(10) Patent No.: US 12,501,571 B2
(45) Date of Patent: Dec. 16, 2025

(54) DISPLAY DEVICE INCLUDING CONNECTION MEMBERS

(71) Applicant: LG ELECTRONICS INC., Seoul (KR)

(72) Inventors: Keumdoo Choi, Seoul (KR); Sangmin Baek, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 543 days.

(21) Appl. No.: 18/013,615

(22) PCT Filed: Jul. 21, 2020

(86) PCT No.: PCT/KR2020/009611
§ 371 (c)(1),
(2) Date: Dec. 29, 2022

(87) PCT Pub. No.: WO2022/019348
PCT Pub. Date: Jan. 27, 2022

(65) Prior Publication Data
US 2023/0328903 A1    Oct. 12, 2023

(51) Int. Cl.
*H05K 5/30* (2025.01)
*H01L 25/075* (2006.01)

(52) U.S. Cl.
CPC ........... *H05K 5/30* (2025.01); *H01L 25/0753* (2013.01)

(58) Field of Classification Search
CPC .... G06F 1/1637; G06F 1/1652; G06F 1/1601; G06F 1/1607; G06F 1/1647; G06F 1/1654; G06F 9/30; G06F 9/3026; H05K 5/30; H05K 5/0217; H05K 5/023; H05K 5/03; H05K 7/1451; H05K 7/1452; H05K 7/1458; H05K 7/1427
See application file for complete search history.

(56) References Cited

U.S. PATENT DOCUMENTS

| 6,813,853 | B1 * | 11/2004 | Tucker | G09F 9/33 345/82 |
| 7,864,516 | B2 * | 1/2011 | Lee | G09F 9/33 345/1.3 |
| 8,097,812 | B2 * | 1/2012 | Wang | G02F 1/13624 174/254 |
| 8,197,088 | B2 * | 6/2012 | Patterson | G01J 3/28 362/249.02 |

(Continued)

FOREIGN PATENT DOCUMENTS

| KR | 20-0436241 Y1 | 7/2007 |
| KR | 10-2008-0020814 A | 3/2008 |

(Continued)

*Primary Examiner* — Abhishek M Rathod
(74) *Attorney, Agent, or Firm* — Birch, Stewart, Kolasch & Birch, LLP

(57) ABSTRACT

A display device using semiconductor light emitting element, and including a display module including semiconductor light emitting element; a frame on which a plurality of the display modules is arranged; a first connection member which fixes the display module onto the frame on a rear surface of the display module, and which provides planar fluidity; and a second connection member having a magnet provided on a side surface of the display module, and applying attractive force to adjacent the display module.

12 Claims, 22 Drawing Sheets

(56) References Cited

U.S. PATENT DOCUMENTS

| | | | |
|---|---|---|---|
| 9,326,620 B1* | 5/2016 | Cross | G09F 15/0068 |
| 9,477,438 B1* | 10/2016 | Hochman | H01R 31/065 |
| 9,741,270 B2* | 8/2017 | Zaccai | G09F 15/0018 |
| 9,830,885 B2* | 11/2017 | Cross | G06F 3/1446 |
| 9,877,406 B2* | 1/2018 | Hochman | G09F 19/22 |
| 10,104,789 B2* | 10/2018 | Shibata | F16M 11/046 |
| 10,803,786 B2* | 10/2020 | Yoon | G09G 3/32 |
| 11,251,333 B2* | 2/2022 | Kim | G02F 1/13336 |
| 11,425,826 B2* | 8/2022 | Brackley | H01L 25/0753 |
| 11,836,005 B2* | 12/2023 | Kim | H01L 23/552 |
| 11,921,549 B2* | 3/2024 | Kim | G09F 9/302 |
| 2009/0289160 A1* | 11/2009 | Kludt | G09F 9/33 |
| | | | 248/226.11 |
| 2011/0002129 A1* | 1/2011 | Zheng | G09F 9/33 |
| | | | 362/375 |
| 2014/0003050 A1* | 1/2014 | Hemiller | H05K 7/14 |
| | | | 362/249.01 |
| 2014/0003052 A1* | 1/2014 | Hemiller | H05K 7/14 |
| | | | 362/249.02 |
| 2014/0375529 A1* | 12/2014 | Yun | G06F 1/1652 |
| | | | 345/1.3 |
| 2015/0362160 A1* | 12/2015 | Andreasen | G09F 9/33 |
| | | | 362/97.1 |
| 2016/0210886 A1* | 7/2016 | Brashnyk | G09F 9/33 |
| 2017/0006727 A1* | 1/2017 | Ryu | H01L 25/0753 |
| 2017/0105293 A1* | 4/2017 | Kim | H05K 5/30 |
| 2017/0286044 A1* | 10/2017 | Kim | G09G 3/3208 |
| 2018/0350278 A1 | 12/2018 | Cross et al. | |
| 2019/0196773 A1* | 6/2019 | Miles | H01R 13/443 |
| 2019/0327843 A1* | 10/2019 | Chang | G02F 1/13336 |
| 2020/0068726 A1* | 2/2020 | Hwang | E05C 19/16 |
| 2020/0194539 A1* | 6/2020 | Kim | G06F 3/1446 |
| 2020/0196462 A1* | 6/2020 | Kim | G09F 9/3026 |

FOREIGN PATENT DOCUMENTS

| | | |
|---|---|---|
| KR | 10-2012-0058055 A | 6/2012 |
| KR | 10-2015-0048673 A | 5/2015 |
| KR | 10-2017-0113926 A | 10/2017 |

* cited by examiner

DISPLAY DEVICE INCLUDING CONNECTION MEMBERS

CROSS REFERENCE TO RELATED APPLICATIONS

This application is the National Phase of PCT/KR2020/009611 filed on Jul. 21, 2020, which is hereby expressly incorporated by reference into the present application.

BACKGROUND

Field

The present disclosure relates to technology related to a display device, and more particularly to a display device using light emitting diodes (LEDs).

Discussion of the Related Art

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

On the other hand, as the demand for a super-large display device or a large-sized display device for indoor use has recently increased, various studies on a display device that is easy to move and install are being conducted. In such a display device, a plurality of display assemblies are sequentially arranged to implement a large-area screen. Each of the plurality of display assemblies may display different screens or display some screens constituting one entire screen.

A conventional display module coupling structure has a problem in that a connector coupling direction is formed perpendicularly to a rear surface of the display module, so that the a module-frame coupling structure becomes thick.

In addition, the conventional display module coupling structure couples the plurality of display modules to a set frame and there is no coupling structure between the display modules, so there is a problem in that gaps may occur between screens. In particular, there is a problem in that the possibility of occurrence of gaps between screens is further increased when the set frame temperature changes or warping caused by external force occurs.

SUMMARY

An object of the present disclosure is to provide a display device having an improved structure so that a plurality of display modules can be easily coupled to each other.

Another object of one embodiment of the present disclosure is to provide a display device having an improved structure to minimize a gap between display modules.

Another object of one embodiment of the present disclosure is to provide a display device in which a connector structure of display modules is improved, resulting in implementation of a thinner display device.

Furthermore, the object of another embodiment of the present disclosure is to solve various problems not mentioned herein. Those skilled in the art may understand it through the full text of the specification and drawings.

In accordance with an aspect of the present disclosure, a display device using a semiconductor light emitting element may include: a display module including the semiconductor light emitting element: a frame in which a plurality of the display modules is arranged: a first connection member configured to fix the display module onto the frame at a rear surface of the display module, and provide planar fluidity; and a second connection member configured to include a magnet provided on a side surface of the display module, and provide attractive force to adjacent the display module.

The first connection member may include: an accommodation portion provided in the frame; and an insertion portion provided on a rear surface of the display module, inserted into the accommodation portion to fix the display module, and having a smaller width than the accommodation portion. The insertion portion may include a first structure connected to the rear surface of the display module; and a second structure connected vertically to an end of the first structure, and including a protrusion provided on an inner surface thereof facing the rear surface of the display module.

In a state where the insertion portion is inserted into the accommodation portion, the second structure may elastically support the protrusion toward the rear surface of the frame.

The protrusion may be continuously formed from an end of the inner surface of the second structure to a portion connected to the first structure; and at least one protrusion may be provided on the inner surface of the second structure.

The second connection member may include: a first magnet provided on a side surface of the display module; and a second magnet provided on a side surface of another display module facing the side surface of the display module, wherein the first magnet and the second magnet are formed at positions facing each other.

The second connection member may include: a magnet having polarity opposite to that of a magnet included in another second connection member adjacent to the second connection member.

The frame may include: a first connector arranged in an upward direction; and a first connector guide configured to fix the first connector to the frame. The display module may include: a second connector arranged in a downward direction so as to be electrically connected to the first connector; and a second connector guide configured to fix the second connector to the display module. At least one of the first connector guide and the second connector guide may be elastically supported in an upward or downward direction.

The first connector guide may include at least one guide protrusion formed to protrude upward from a portion that is in contact with the second connector guide. The second connector guide may include at least one guide hole formed to accommodate the guide protrusion therein.

The frame may further include: a module control circuit electrically connected to the first connector to control the plurality of the display modules.

The display device may further include a side case formed to cover a side surface of the display device, wherein the side case is coupled to the second connection member of the display module by magnetic attraction.

Advantageous Effects

As is apparent from the above description, the embodiments of the present disclosure can implement a large display device using a plurality of display modules.

Specifically, the plurality of display modules has plane fluidity on a frame, may be coupled to each other by magnetic attraction therebetween, so that a gap between the display modules can be minimized in size, thereby realizing a continuous and stable large screen display device.

According to another embodiment of the present disclosure, the frame of the display device can be prevented from being bent or warped by magnetic attraction between the display modules, resulting in reduction in thickness of the display device.

In addition, the embodiments of the present disclosure can implement a slimmer display device through a connector coupling structure using a horizontal structure connection arranged in a vertical direction than the conventional display device.

Furthermore, according to another embodiment of the present disclosure, there are additional effects not mentioned herein. Those of ordinary skill in the art may understand it through the full text of the specification and drawings.

DETAILED DESCRIPTION OF THE EMBODIMENTS

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like.

Terms including ordinal numbers such as first, second, etc. may be used to explain various elements. However, it will be appreciated that the elements are not limited to such terms. These terms are merely used to distinguish one element from another.

Figure 1:
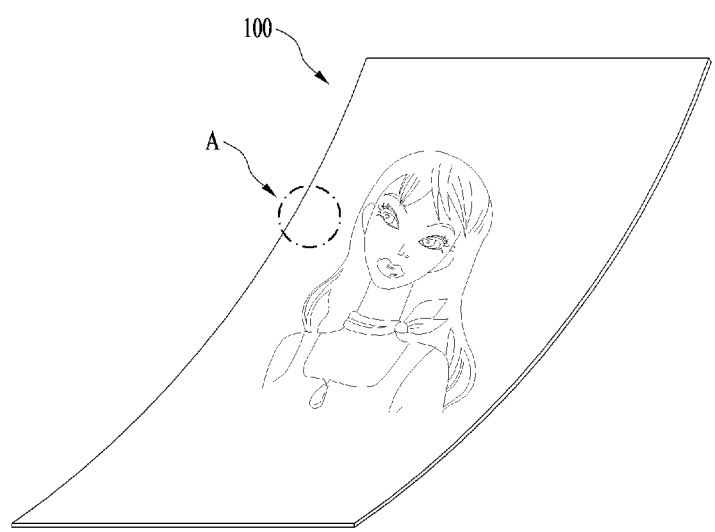
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
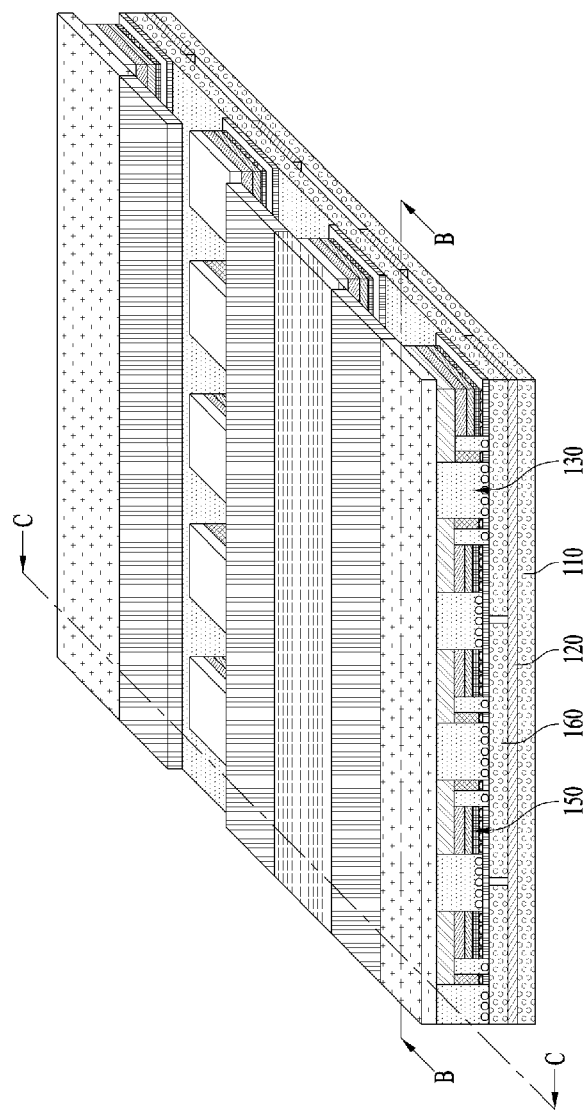
FIG. 2 is a partially enlarged diagram showing a part A shown in FIG. 1.

FIG. 2 is a partially enlarged view showing part A of FIG. 1.

Figure 3A:
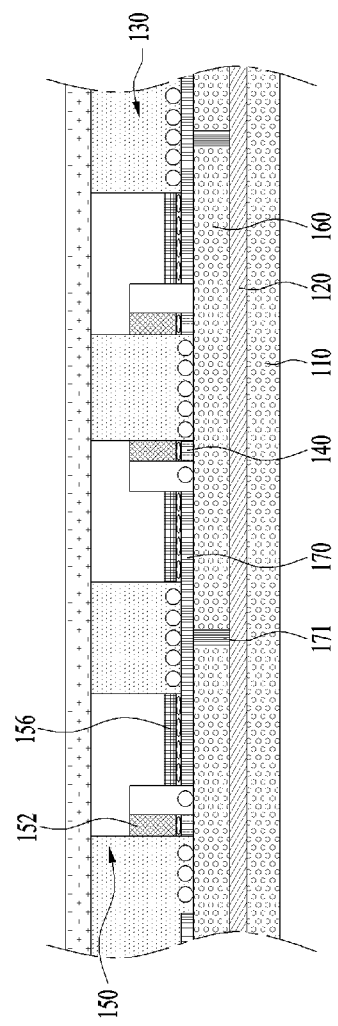
FIGS. 3A and 3B are cross-sectional diagrams taken along the cutting lines B-B and C-C in FIG. 2.
Figure 3B:
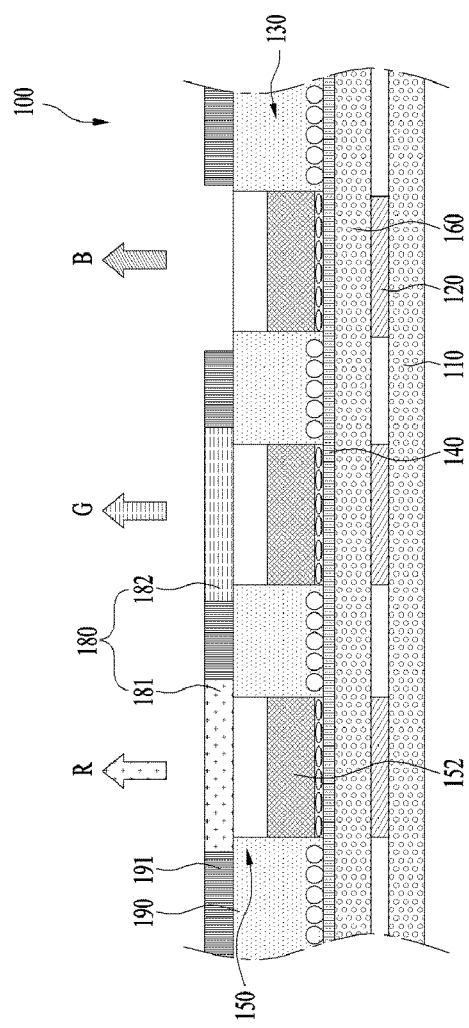

FIGS. 3A and 3B are cross-sectional views taken along lines B-B and C-C in FIG. 2.

Figure 4:
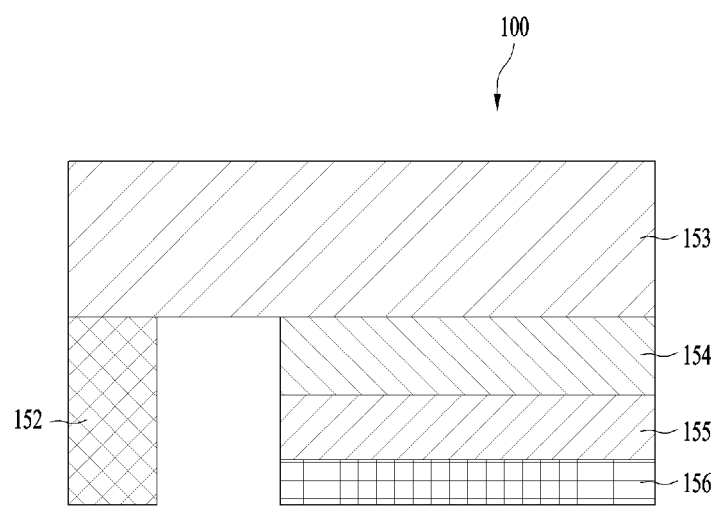
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
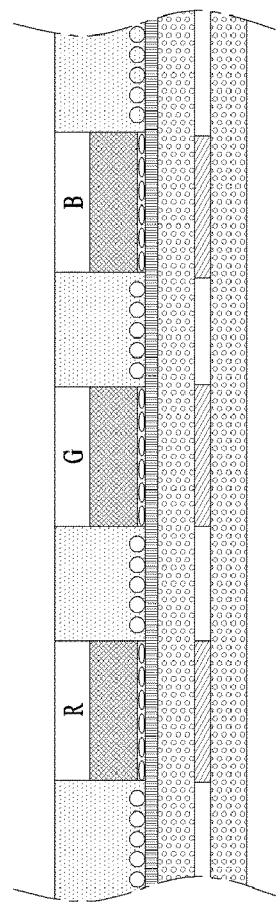
FIGS. 5A to 5C are conceptual diagrams illustrating various examples of color implementation with respect to a flip-chip type semiconductor light emitting element.
Figure 5B:
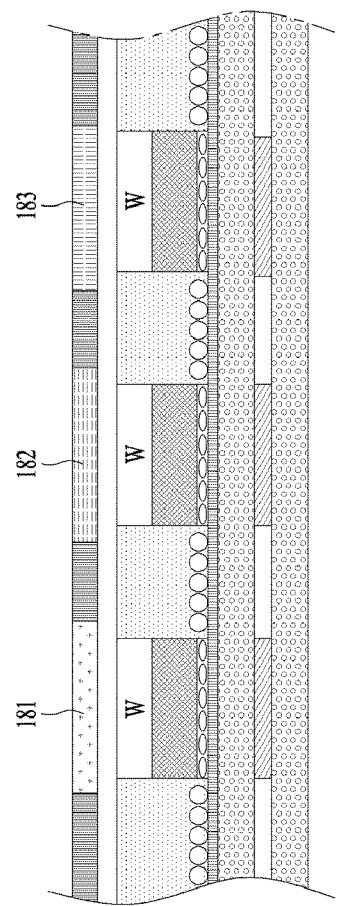
Figure 5C:
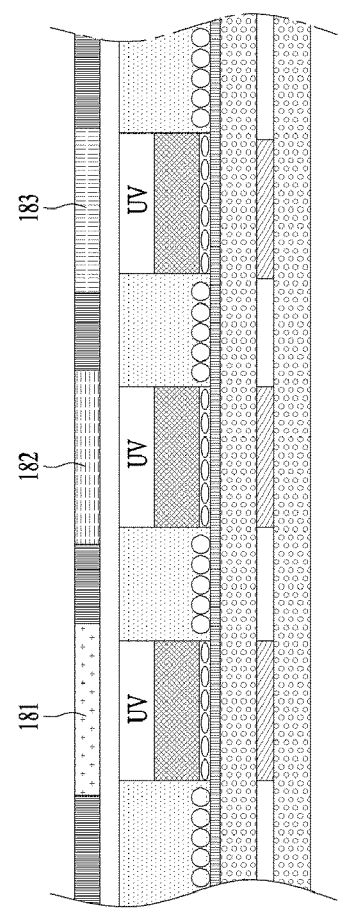

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity: For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 182, and a blue phosphor conversion layer 183 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 µm or less, and the device may have a rectangular or square shape. When the semiconductor light emitting element has a rectangular shape, the size thereof may be less than or equal to 20 µm×80 µm.

In addition, even when a square semiconductor light emitting element having a side length of 10 µm is used as a unit pixel, sufficient brightness to form a display device may be obtained.

Therefore, for example, in case of a rectangular pixel having a unit pixel size of 600 µm×300 µm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
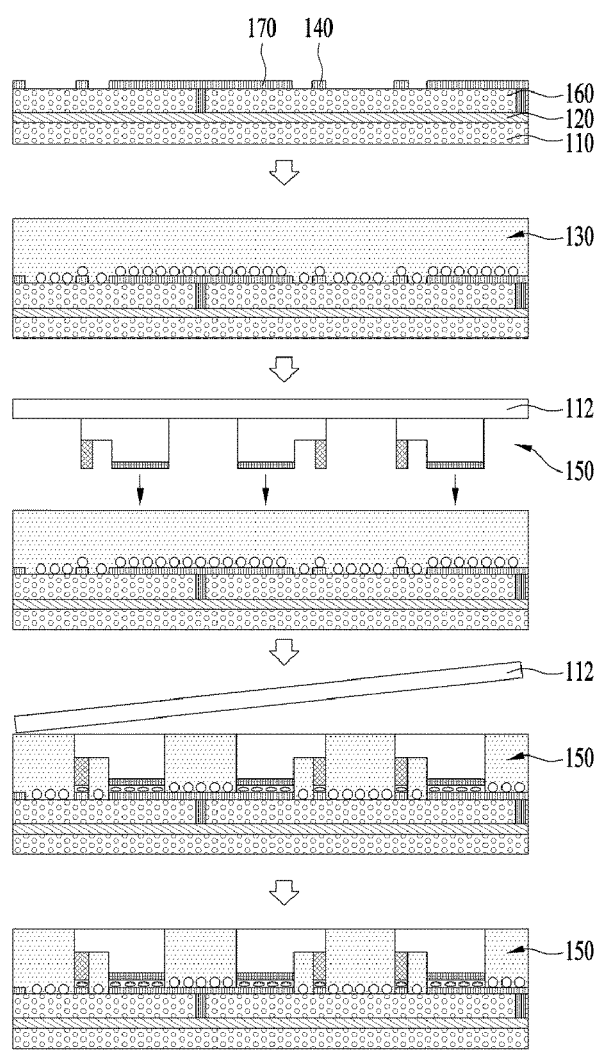
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
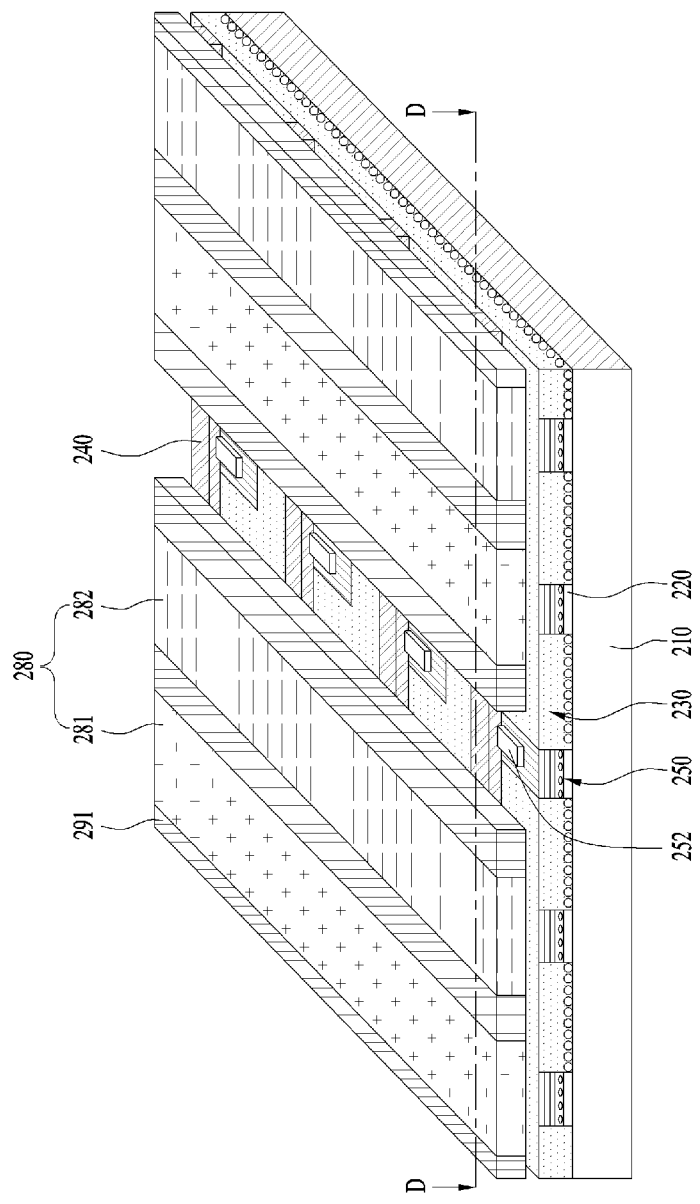
FIG. 7 is a perspective diagram of a display device using a semiconductor light emitting element according to another embodiment of the present disclosure.
Figure 8:
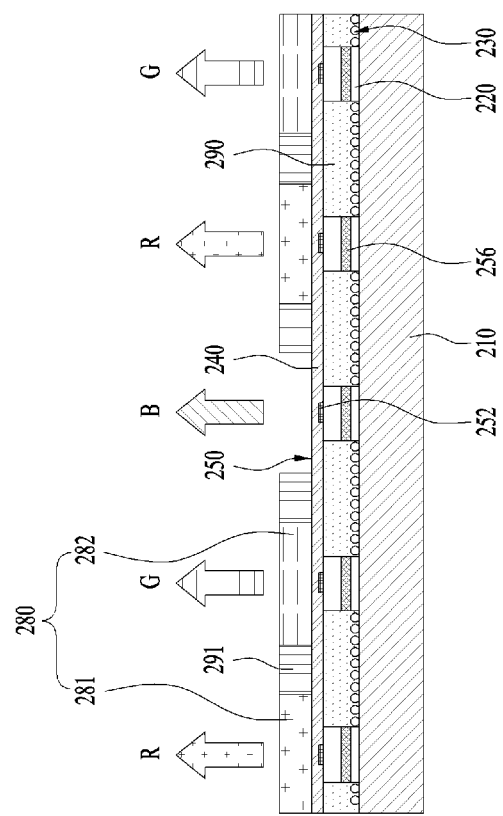
FIG. 8 is a cross-sectional diagram taken along a cutting line D-D shown in FIG. 8.
Figure 9:
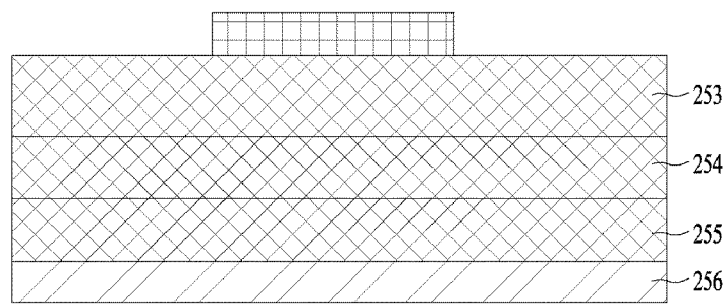
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220) is located on the substrate 210, if the semiconductor light emitting element 250) is connected by applying heat and pressure thereto, the semiconductor light emitting element 250) is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250) and the first electrode 220 as well as mechanical connection.

Thus, the semiconductor light emitting element 250) is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240) described later. Since such a vertical type semiconductor light emitting element 250) can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240) is located between the semiconductor light emitting elements 250 and connected to the semiconductor light emitting elements electrically. For example, the semiconductor light emitting elements 250) are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240) and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240) on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

For a large screen high pixel display device based on semiconductor light emitting elements, the semiconductor light emitting elements grown on a growth substrate need to be assembled or transferred to a new substrate as described above. The growth substrate may be, for example, a 12-inch wafer, and thus transferring may be repeated multiple times.

For example, the assembly or transfer process may be a process in which a very large number of semiconductor light emitting elements are arranged on a new substrate all at once. However, during the arrangement process, the semiconductor light emitting elements may be arranged at positions different from determined positions so that arrangement errors may occur.

After the assembling or transferring, a wiring process for electrically connecting the semiconductor light emitting elements may be performed. When the range of the arrangement errors exceeds a certain specification range, the semiconductor light emitting elements may cause a short or open defect.

Experimentally, the alignment error range should be managed to a level of ±3 µm, which is the most important factor in display panel production yield.

Figure 10:
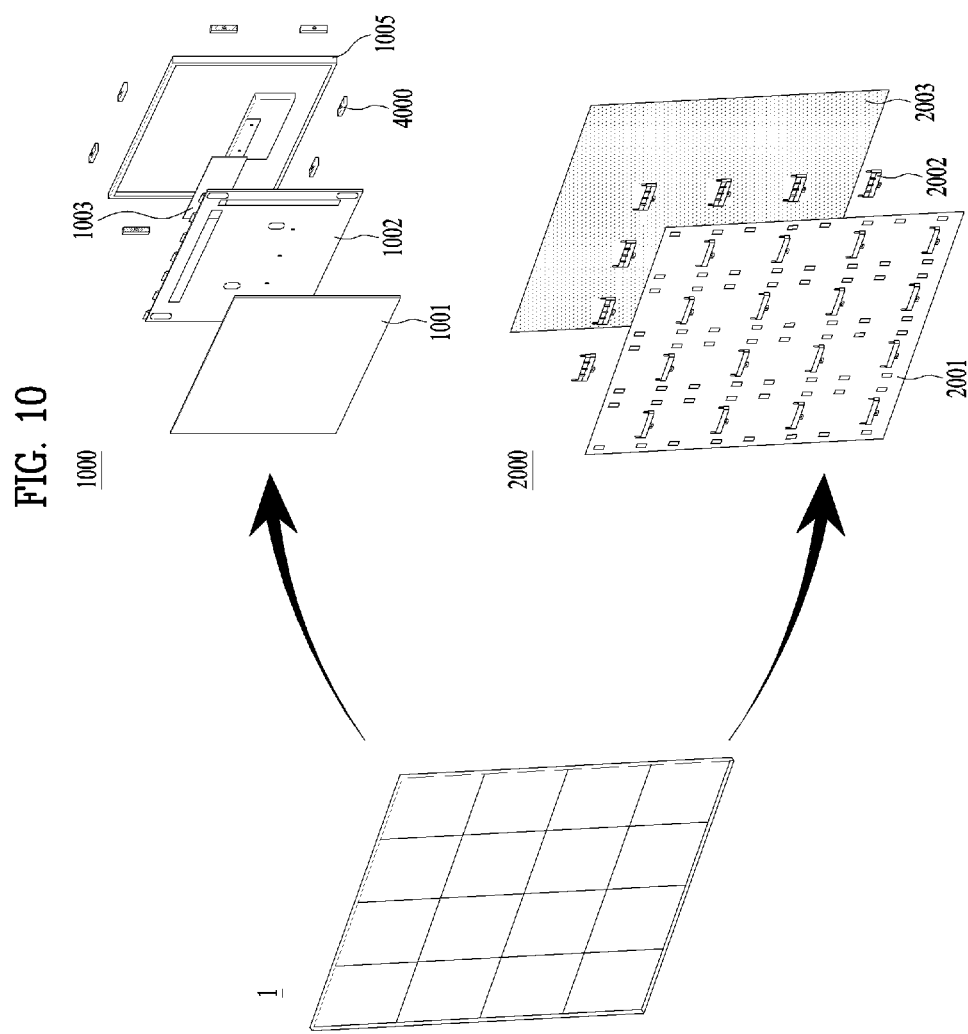
FIG. 10 is an exploded view illustrating a structure of a display device according to an embodiment of the present disclosure.

FIG. 10 is a conceptual diagram illustrating a configuration of a display device 1 using a semiconductor light emitting element according to an embodiment of the present disclosure.

Referring to FIG. 10, the display device 1 using the semiconductor light emitting element may be formed of a combination structure of a plurality of display modules 1000 and a frame unit 2000.

Each display module 1000 may include a display panel 1001, a module bottom 1002, a module circuit unit 1003, a connection member 1004, and a module cover 1005.

The display panel 1001 serving as a display panel using the semiconductor light emitting element may include a micro LED as a light emitting device. Specific examples of the present disclosure will be described with reference to FIGS. 1 and 2.

Meanwhile, the frame unit 2000 may include a frame 2001 coupled to the display module 1000, a connector bracket 2002 coupled to a connector of the display module 1000, and a back cover 2003.

As can be seen from FIG. 10, the display device 1 using the semiconductor light emitting element according to the present disclosure may be formed by coupling at least one display module 1000 to a front surface of the frame 2001 side by side.

Figure 11:
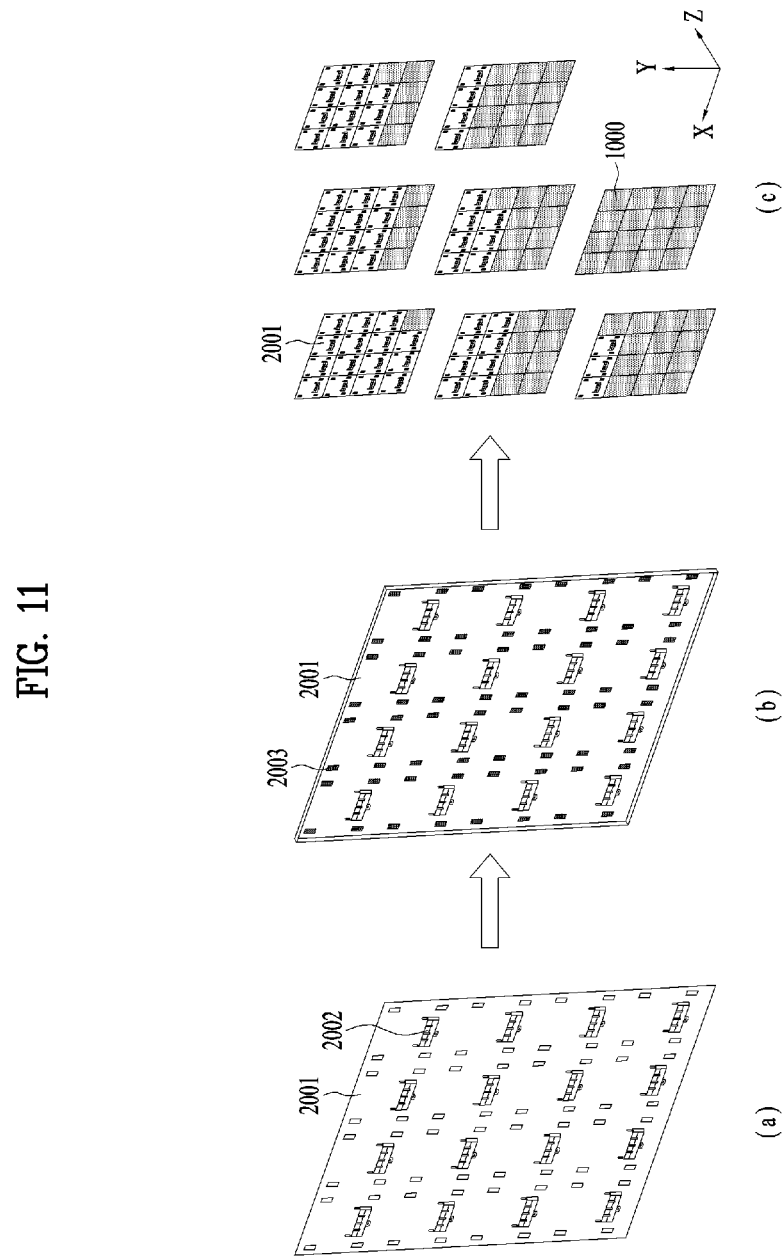
FIG. 11 is a conceptual diagram illustrating an assembly process of a display device according to an embodiment of the present disclosure.

FIG. 11 is a conceptual diagram illustrating an assembly process of the display device according to an embodiment of the present disclosure.

First, as shown in FIG. 11(a), the frame 2001 and the connector bracket 2002 may be coupled to each other. Then, as shown in FIG. 11(b), the back cover 2003 may be coupled to the rear surface of the frame 2001.

Referring to FIG. 11(c), the plurality of display modules 1000 may be sequentially coupled to a predetermined position of the frame 2001. For example, the plurality of display modules 1000 may be sequentially coupled to the frame 2001 from the lower end of a frame 2001. However, the order of combining the plurality of display modules 1000 may be determined differently.

Specifically, the plurality of display modules 1000 may be grid-arranged along a plurality of rows and columns on the frame 2001. In this case, the plurality of display modules 1000 may be sequentially coupled to the frame 2001 from a row of the lower end of the frame 2001.

The order shown in FIG. 11 is not necessarily limited to the above order. For user convenience, the assembly of the display device can be performed by taking any one step from among steps of FIG. 11(a) to FIG. 11(c) as a first step.

However, when the plurality of display modules 1000 is grid-arranged, the display modules 1000 may not physically maintain a complete close contact state therebetween due to at least one of a fabrication difference and warping of the frame. The gap between the display modules 1000 may be considered to be a critical problem in the display device in which light emitting diodes (LEDs) are provided as micro LEDs. Accordingly, a coupling structure for removing gaps between the plurality of display modules 100 will hereinafter be described in detail.

Hereinafter, a coupling member of the display device according to an embodiment of the present disclosure will be described in more detail.

Figure 12:
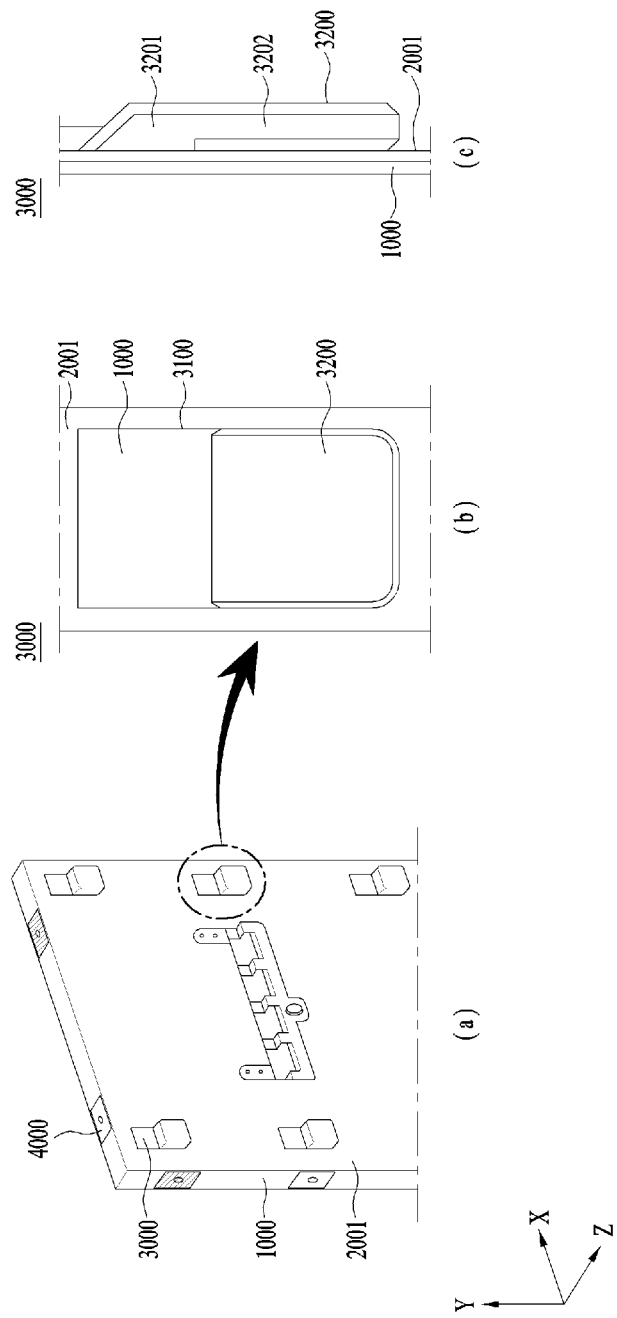
FIG. 12 is a conceptual diagram illustrating a structure of a first connection member of a display device according to an embodiment of the present disclosure.

FIG. 12 is a conceptual view illustrating a structure of a first connection member 3000 of the display device according to an embodiment of the present disclosure.

Referring to FIG. 12, the display device according to an embodiment of the present disclosure may include a plurality of display modules 1000 provided with the semiconductor light emitting element, a frame 2001 in which the plurality of display modules 1000 is arranged, a first connection member, a magnet, and a second connection member. The first connection member may fix each display module 1000 to the frame 2001 on the rear surface of the display module 1000, thereby providing planar fluidity. The magnet may be provided on a side surface of each of the display modules 1000. The second connection member may provide attractive force to adjacent display modules 1000.

FIG. 12(a) is a perspective view of a state in which the display module 1000 and the frame 2001 are coupled to each other according to an embodiment of the present disclosure.

Referring to FIG. 12(a), the display module 1000 and the frame 2001 may be coupled to each other through the first connection member 3000. Meanwhile, a second connection member 4000 may be provided on a side surface of the display module 1000 so as to be coupled to another display module adjacent to the display module 1000.

The first connection member 3000 may be disposed on the rear surface of the display module 1000.

The first connection member may include an accommodation portion 3100 provided in the frame 2001, and an insertion portion 3200. The insertion portion 3200 may be provided on the rear surface of the display module 1000, may be inserted into the accommodation portion 3100 to fix the display module 1000, and may have a smaller width than the accommodation portion 3100.

More specifically, the first connection member 3000 may include the accommodation portion 3100 provided at a predetermined position of the frame 2001, and the insertion portion 3200 provided on the rear surface of the display module 1000 at a position where the insertion portion faces the accommodation portion 3100.

The insertion portion 3200 may be inserted into the accommodation portion 3100 to fix the display module 1000 to the frame 2001.

In addition, the first connection member may have planar fluidity in the X-axis or Y-axis direction on the front surface of the frame 2001 of the display module 1000 in a state where the insertion portion 3200 is inserted into the accommodation portion 3100. Accordingly, even when the frame 2001 expands or contracts due to temperature changes in the surrounding environment, the display module 1000 can be properly moved on the plane of the frame 2001 to maintain a coupled state between the adjacent display modules 1000.

In one embodiment, the accommodation portion 3100 may be a groove formed to penetrate the frame 2001, and may be configured as a groove wider than the insertion portion 3200. Accordingly, the insertion portion 3200 can move within a predetermined range even when inserted into the accommodation portion 3100, and the display module 1000 connected to the insertion portion 3200 can also move within the predetermined range.

In one embodiment, the insertion portion 3200 can be formed in a structure to be caught in a groove included in the accommodation portion 3100. Therefore, the accommodation portion 3100 may be an accommodation groove, and the insertion portion 3200 is also a hooking portion formed in a structure to be caught in the accommodation groove.

In addition, the insertion portion 3200 may include a first structure 3201 and a second structure 3202. The first structure 3201 may be connected to the rear surface of the display module 1000. The second structure 3202 may be vertically connected to the end of the first structure 3201, and may include a protrusion 3203 provided on an inner surface facing the rear surface of the display module 1000.

FIG. 12(b) is a front view of the first connection member viewed from the rear surface of the frame 2001, and FIG. 12(c) is a side view of the first connection member viewed from the rear surface of the frame 2001.

As shown in FIG. 12(b), the first connection member may include an insertion portion 3200 and an accommodation portion 3100. The insertion portion 3200 can be formed to be caught in and inserted into the accommodation portion 3100. Accordingly, the display module 1000 may be coupled to the frame 2001 so as not to be movable in the Z axis.

More specifically, as shown in FIG. 12(c), the insertion portion 3200 may include a first structure 3201 and a second structure 3202. The first structure 3201 may extend in the Z-axis direction from a predetermined position on the rear surface of the display module 1000, and the second structure 3202 may extend vertically from the end of the first structure 3201. A predetermined space into which the accommodation portion 3100 of the frame (2001) can be inserted may be provided between the second structure 3202 and the rear surface of the display module 1000.

In one embodiment, the end of the second structure 3202 may be curved so that the insertion portion 3200 can be easily inserted into the accommodating portion 3100.

In one embodiment, the second structure 3202 may have a smaller width than the first structure 3201 so that the insertion portion 3200 can be easily inserted into the accommodation portion 3100.

In the first connection member 3000, the accommodation portion 3100 may have a larger width than the insertion portion 3200, so that the display module 1000 can move by a predetermined distance in the X-axis direction while being coupled to the frame 2001. Since the insertion portion 3200 is inserted into the accommodation portion 3100 and is caught in the Y-axis direction, the display module 1000 can move by a predetermined distance in the Y-axis direction while being coupled to the frame 2001. The X-axis and the Y-axis may correspond to axes located on a plane formed by the front surface of the frame 2001. Also, planar fluidity of the display module 1000 may mean fluidity in the X-axis and Y-axis directions.

Having such fluidity in the X-axis and Y-axis directions in a state in which the display module 1000 is coupled to the frame 2001 is advantageous in removing a gap formed between the display modules 1000 using the second connection member 4000. However, having fluidity in the Z-axis direction in a state in which the display module 1000 is coupled to the frame 2001 causes a Z-axis directional step difference between the display modules 1000, which may be problematic. Hereinafter, a structure for preventing Z-axis directional movement of the display module 1000 will be described.

Figure 13:
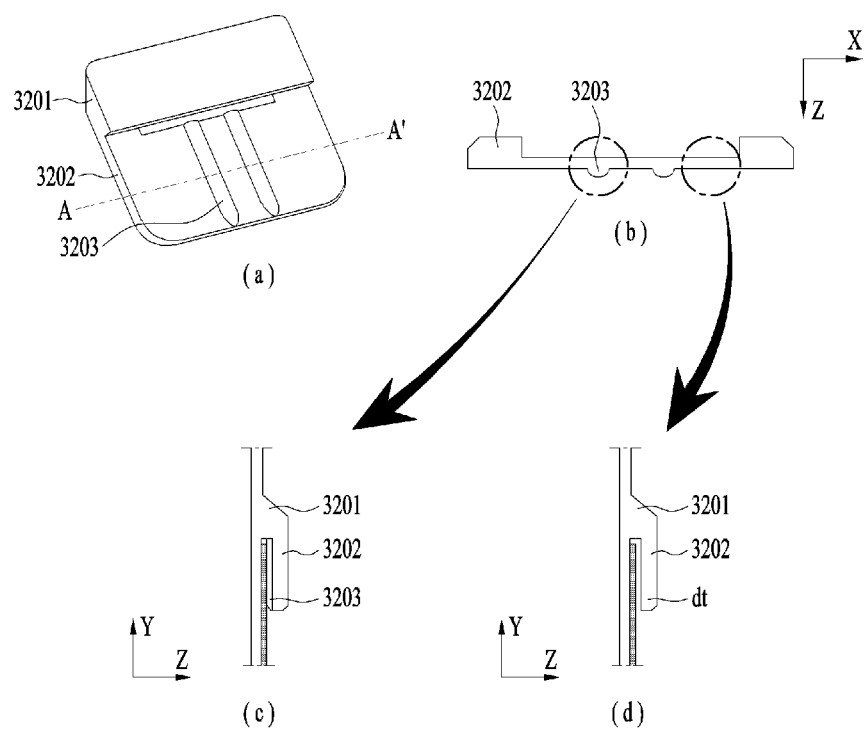
FIG. 13 is a conceptual diagram illustrating a cross-sectional structure of a first connection member shown in FIG. 12.

FIG. 13 is a conceptual view illustrating a cross-sectional structure of the second structure 3202 included in the insertion portion 3200.

In one embodiment, the second structure 3202 may further include a protrusion 3203 protruding to a predetermined height on an inner surface facing the rear surface of the display module 1000.

As shown in FIG. 13(a), at least one protrusion 3203 may be provided on the inner surface of the second structure 3202.

FIG. 13(b) is a cross-sectional view of the second structure 3202 taken along the line A-A' of FIG. 13(a).

As shown in FIG. 13(b), the cross-sectional shape of the protrusion 3203 may be a semicircular shape, without being limited thereto. The cross-sectional shape of the protrusion 3203 may be a rectangular shape or may be a triangular or quadrangular shape gradually narrowing in the protruding direction. Also, the plurality of protrusions 3203 may be different in cross-sectional shape from each other.

In a state in which the insertion portion 3200 is inserted into the accommodation groove, the second structure 3202 may elastically support the protrusion 2303 in the rear direction (Z-axis direction) of the frame 2001. Accordingly, the display module 1000 can be firmly fixed to the frame 2001 even if a certain level of tolerance occurs in the process of manufacturing the insertion portion 3200.

As shown in FIGS. 13(c) and 13(d), in a state in which the accommodation portion 3100 of the frame 2001 is inserted between the second structure 3202 and the rear surface of the display module 1000, a tolerance (dt) of a manufacturing process may exist. However, even if the tolerance exists, as the protrusion 3203 is present, the second structure 3202 and the frame 2001 may come into close contact with each other.

Accordingly, the display module 1000 can be stably coupled to the frame 2001 without z-axis movement.

The second structure 3202 has elasticity, and may tightly fix the display module 1000 to the frame 2001 in the Z-axis direction using the protrusion 3203. As the display module 1000 is tightly fixed to the frame 2001 without movement in the Z-axis direction, a step difference between the display modules 1000 in the Z-axis direction can be offset.

In one embodiment, the protrusions 3203 may be continuously formed from the end of the inner surface of the second structure 3202 to a portion connected to the first structure 3201, and at least one protrusion 3203 may be provided on the inner surface of the second structure 3202. According to the embodiment, a line contact between the frame 2001 and the end of the protrusion 3203 is constantly maintained so that contact frictional force in the vertical direction can be reduced. As a result, the display module 1000 can be easily coupled to the frame 2001.

In one embodiment, the protrusion 3203 may be formed as a conical, hemispherical, or various polyhedral protrusions, and may be formed in plural on the inner surface of the second structure 3202.

The display module 1000 may be connected to the frame 2001 in a state in which planar movement is possible at predetermined intervals using the first connection member 3000, and may maintain a close contact state with another adjacent display module 1000 through the second connection member 400. Hereinafter, the structure of the second connection member 400 will be described.

Figure 14:
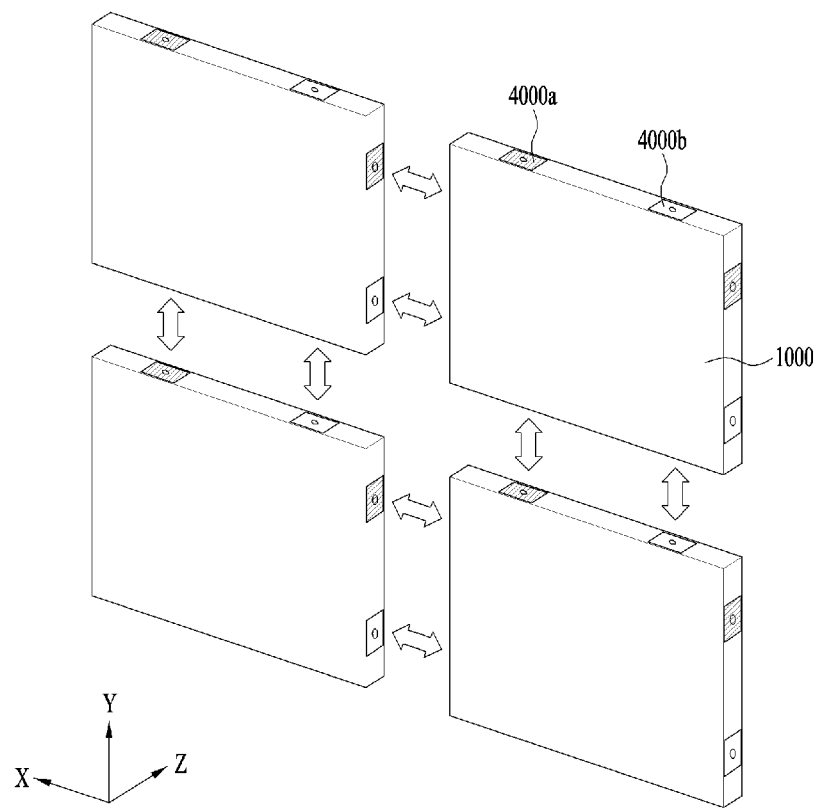
FIG. 14 is a conceptual diagram illustrating a structure of a second connection member of a display device according to an embodiment of the present disclosure.

FIG. 14 is a conceptual view illustrating a structure of a second connection member of the display device according to an embodiment of the present disclosure.

In one embodiment, the second connection member is provided on a side surface of the display module 1000 to provide magnetic attraction between display modules 1000 adjacent to each other. Accordingly, the display modules 1000 are arranged side by side without a complicated fastening structure, such that the display modules 1000 can be coupled to each other.

In one embodiment, the second connection member may include a first magnet provided on a side surface of the display module 1000, and a second magnet provided on a side surface of another display module 1000 facing the side surface of the display module 1000. The first magnet and the second magnet may be arranged to face each other.

The second connection member may be disposed at each side of the display module 1000. Accordingly, magnetic attraction may be provided between the display module 1000 and other display modules 1000 horizontally or vertically adjacent to the display module 1000.

In one embodiment, at least one second connection member may be provided for each side surface of the display module 1000. As the size of the display module 1000 increases, stronger attraction is required for interconnection between the display modules 1000, so that an appropriate number of second connection members may be provided for such stronger attraction.

The second connection member may be disposed at a predetermined position where each side of the display module 1000 is equally divided. Accordingly, the second connection member can provide constant magnetic attraction without being focused on a specific part of each side.

As the second connection member provides magnetic attraction, coupling between the plurality of display modules 1000 can be maintained without a gap between the display modules 1000 even in a situation where the display modules 1000 move in a certain range on the frame 2001. In addition, the display modules are closely coupled to each other by magnetic attraction, so that it is possible to configure a large screen in which a plurality of displays is naturally and continuously coupled to each other.

In addition, according to one embodiment of the present disclosure, in a situation where the second connection member provides magnetic attraction, even when the frame 2001 is bent with a predetermined curvature in the forward or backward direction, the display modules 1000 connected to the frame 2001 can continuously maintain their coupling in response to the predetermined curvature.

In one embodiment, the second connection member may include a magnet having polarity opposite to that of a magnet included in another adjacent second connection member. For example, if the second connection member 4000*a* of any one portion includes an N-pole magnet, another adjacent second connection member 4000*b* may include an S-pole magnet.

In the same arrangement principle, the second connection member may alternately include N-pole and S-pole magnets along the side surfaces of the display module 1000.

In one embodiment, either the first magnet or the second magnet may be formed of a magnetic material. Accordingly, any one portion of the first magnet and the second magnet can be formed of a relatively inexpensive and high-strength material instead of a magnet, so that production costs can be reduced and system stability can be increased.

Figure 15:
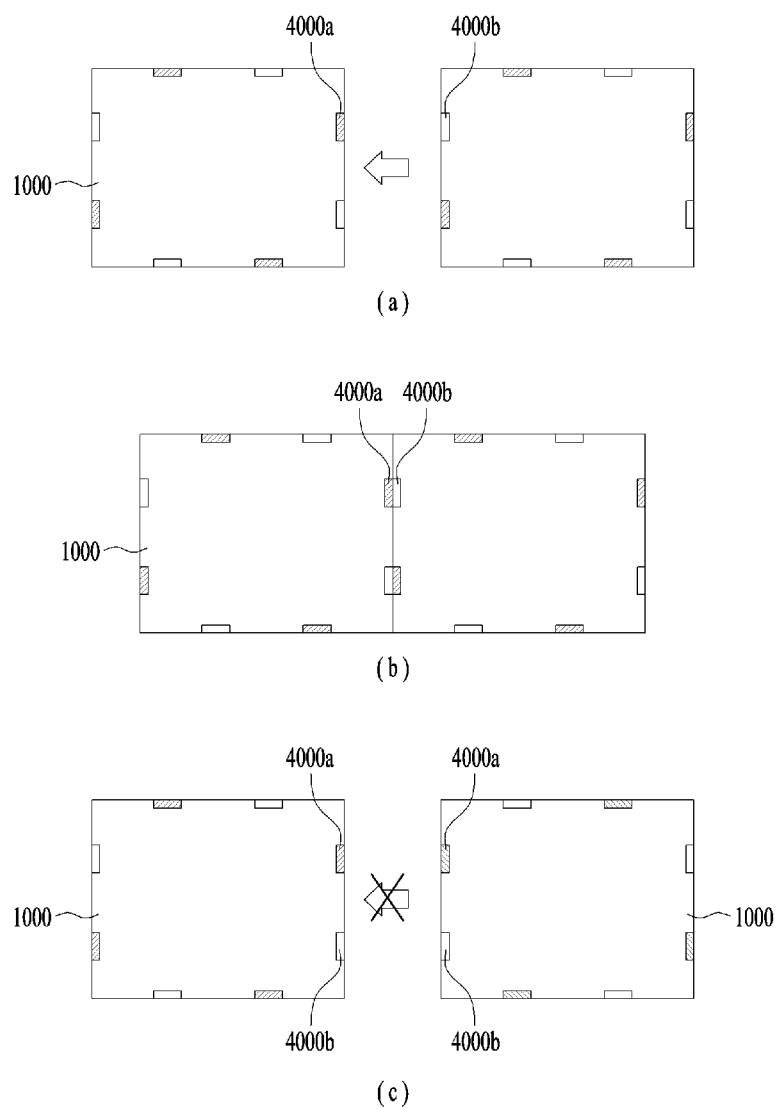
FIG. 15 is a conceptual diagram illustrating a coupling structure of a second connection member shown in FIG. 14.

FIG. 15 is a conceptual diagram illustrating coupling between the plurality of display modules 1000 using a second connection member.

Referring to FIG. 15, plural adjacent display modules 1000*a* and 1000*b* are coupled to each other by magnetic attraction provided by the second connection member.

As shown in FIG. 15(*a*), a user may fail to arrange the display modules 1000 at accurate positions. According to one embodiment of the present disclosure, as the second connection member includes a first magnet and a second magnet at positions where the first magnet and the second magnet face each other, the display modules 1000 can be naturally adjusted to their accurate coupling positions by magnetic attraction provided by the magnets. Therefore, since the user need not worry about the exact coupling position of the display modules 1000, the user can accurately combine the plurality of display modules 1000 as shown in FIG. 15(*b*) only by reducing the distance between the display modules 1000.

To this end, the second connection member 4000*a* provided on the side surface of the display module 1000 may be provided to face the second connection member 4000*b* provided on the side surface (opposite surface) of the adjacent display module 1000. The second connection members 4000*a* and 4000*b* may be located on the side surface of each display module 1000 in a manner that the display module 100 and adjacent display modules 1000 can be coupled to each other in an X-directional width or a Y-directional height.

Meanwhile, according to an embodiment of the present disclosure, the second connection member may include a magnet having an opposite polarity to the other magnet included in another adjacent second connection member. Therefore, as shown in FIG. 15(*c*), when the user incorrectly arranges the vertical or horizontal direction of the display modules 1000, incorrect coupling between the display modules 1000 can be prevented by magnetic repulsive force provided by the second connection member having the same polarity.

Figure 16:
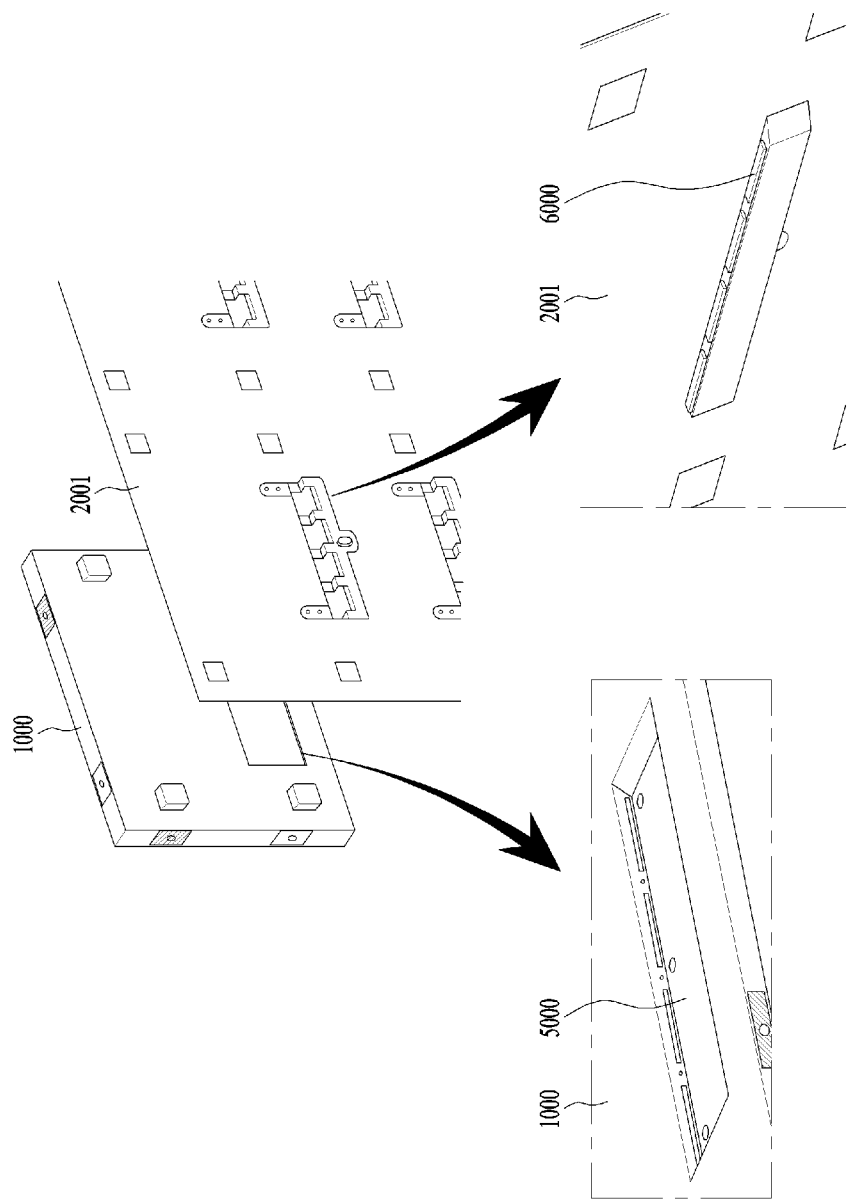
FIG. 16 is a conceptual diagram illustrating a structure of a connector unit of a display device according to an embodiment of the present disclosure.

FIG. 16 is a conceptual view illustrating a structure of a connector unit of the display device according to an embodiment of the present disclosure.

In one embodiment, a second connector unit 5000 may be formed on the rear surface of the display module 1000, and a first connector unit 6000 may be formed on the front surface of the frame 2001 to which the display module 1000 is coupled.

At least one second connector unit may be formed on the rear surface of the display module 1000. In this case, the number of first connector units may be equal to the number of second connection units provided in the plurality of display modules 1000.

The first connector unit and the second connector unit may be coupled to each other in a conductive state, thereby forming a connector assembly 7000. Such coupling may be formed by physical contact between the first and second connector units.

Figure 17:
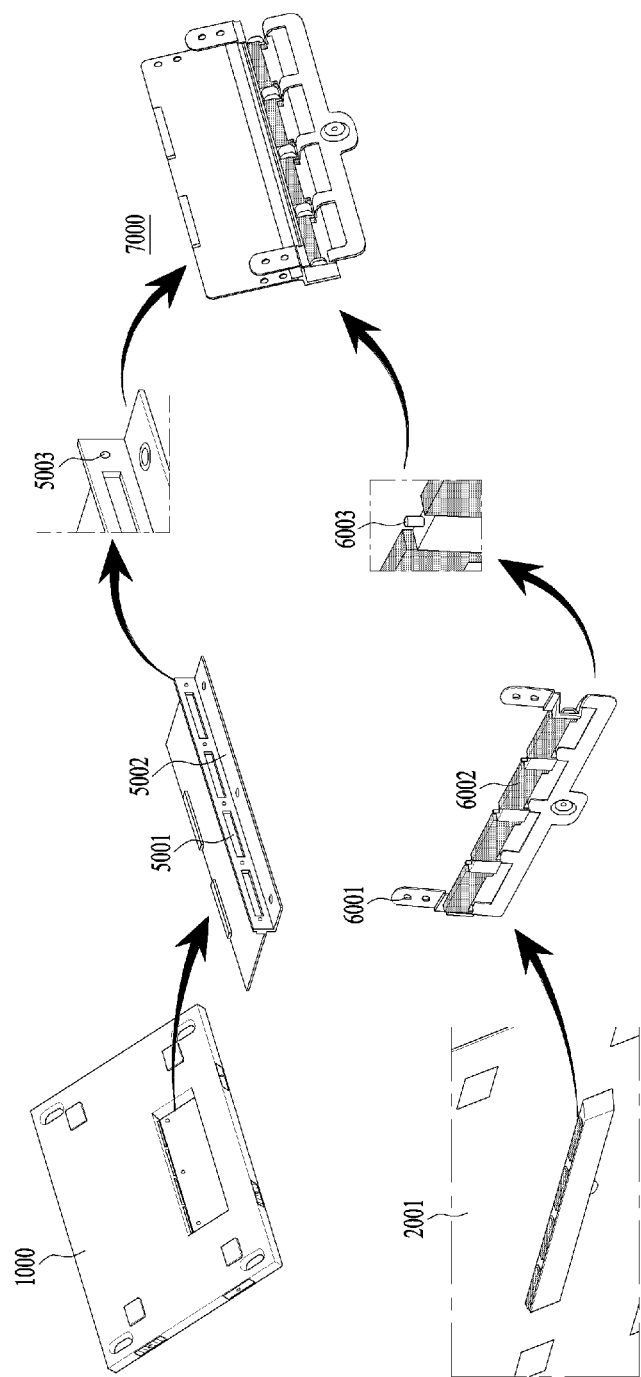
FIG. 17 is a conceptual diagram illustrating a specific structure of the connector unit shown in FIG. 16.

FIG. 17 is a conceptual view illustrating a specific structure of the connector units of FIG. 16.

Referring to FIG. 17, the frame 2001 may include a first connector 6001 arranged in an upward direction and a first connector guide 6002 for fixing the first connector 6001 to the frame 2001. The display module 1000 may include a second connector 5001 arranged in a downward direction, and a second connector guide 5002. The second connector 5001 may be electrically connected to the first connector 6001. The second connector guide 5002 may fix the second connector 5001 to the display module 1000.

The coupling portion of the second connector 5001 may be formed from the rear surface of the display module 1000 toward the bottom of the display module 1000. The second connector 5001 may include at least one electrical coupling portion.

The second connector guide 5002 may be provided at one end of the second connector 5001. The second connector guide 5002 may include a portion connected to the second connector 5001 and a portion connected to the rear surface of the display module 1000. The second connector guide 5002 may serve to fix the second connector 5001 to a predetermined position of the display module 1000.

The coupling portion of the first connector 6001 may be formed from the front surface of the frame 2001 toward the top of the frame 2001. The first connector 6001 may include at least one electrical coupling portion.

The first connector guide 6002 may be provided at one end of the first connector 6001. The first connector guide 6002 may include a portion connected to the first connector 6001 and a portion connected to the front surface of the frame 2001. The first connector guide 6002 may serve to fix the first connector 6001 to a predetermined position of the frame 2001.

The first connector 6001 and the second connector 5001 can be electrically connected to each other. Accordingly, the module circuitry mounted on the display module 1000 may receive an electrical signal from the frame 2001 or the outside of the frame 2001.

The first connector unit and the second connector unit may be coupled to each other to form a connector assembly 7000.

In one embodiment, at least one of the first connector guide 6002 and the second connector guide 5002 can be formed to be elastically supported in an upward or downward direction.

For example, the first connector guide 6002 may be formed to be elastically supported in an upward or downward direction. Accordingly, a predetermined portion of the first connector 6001 connected to the first connector guide 6002 may also elastically move upward or downward. Accordingly, even if the display module 1000 or the frame 2001 moves upward or downward within a predetermined range, coupling of the connector assembly 7000 can be continuously maintained due to upward or downward elastic support of the first connector guide 6002.

In addition, the second connector guide 5002 may be formed to be elastically supported in the upper or lower direction. In this case, a portion of the second connector 5001 connected to the second connector guide 5002 may also elastically move upward or downward.

In one embodiment, both the first connector guide 6002 and the second connector guide 5002 may be formed to be elastically supported in the upper or lower direction. Accordingly, the elastically supported range is widened, and even when the display module 1000 or the frame 2001 has a wide upward or downward movement range, coupling of the connector assembly 7000 can be stably maintained.

In one embodiment, the first connector guide 6002 may include at least one guide protrusion 6003 protruding upward from a portion that is in contact with the second connector guide 5002. The second connector guide 5002 may include at least one guide hole 5003 capable of accommodating the side protrusion therein.

The guide protrusion 6003 may extend from one end of the first connector guide 6002, and may be formed to protrude in a cylindrical shape, a square column shape, or various shapes.

A guide hole 5003 may be formed such that the guide protrusion 6003 can be inserted into a portion that is in contact with the first connector guide 6002 of the second connector guide 5002. When a plurality of guide protrusions 6003 is formed, a plurality of guide holes 5003 may also be formed to correspond to the plurality of guide protrusions 6003. The cross-sectional area of each guide protrusion 6003 may be smaller than or equal to the area of each guide hole 5003, so that the guide protrusion 6003 can be stably accommodated in the guide hole 5003.

Due to the coupling of the guide hole 5003 and the guide protrusion 6003, the first and second connector guides 5002 can be stably coupled at a more accurate position to form the connector assembly 7000.

Figure 18:
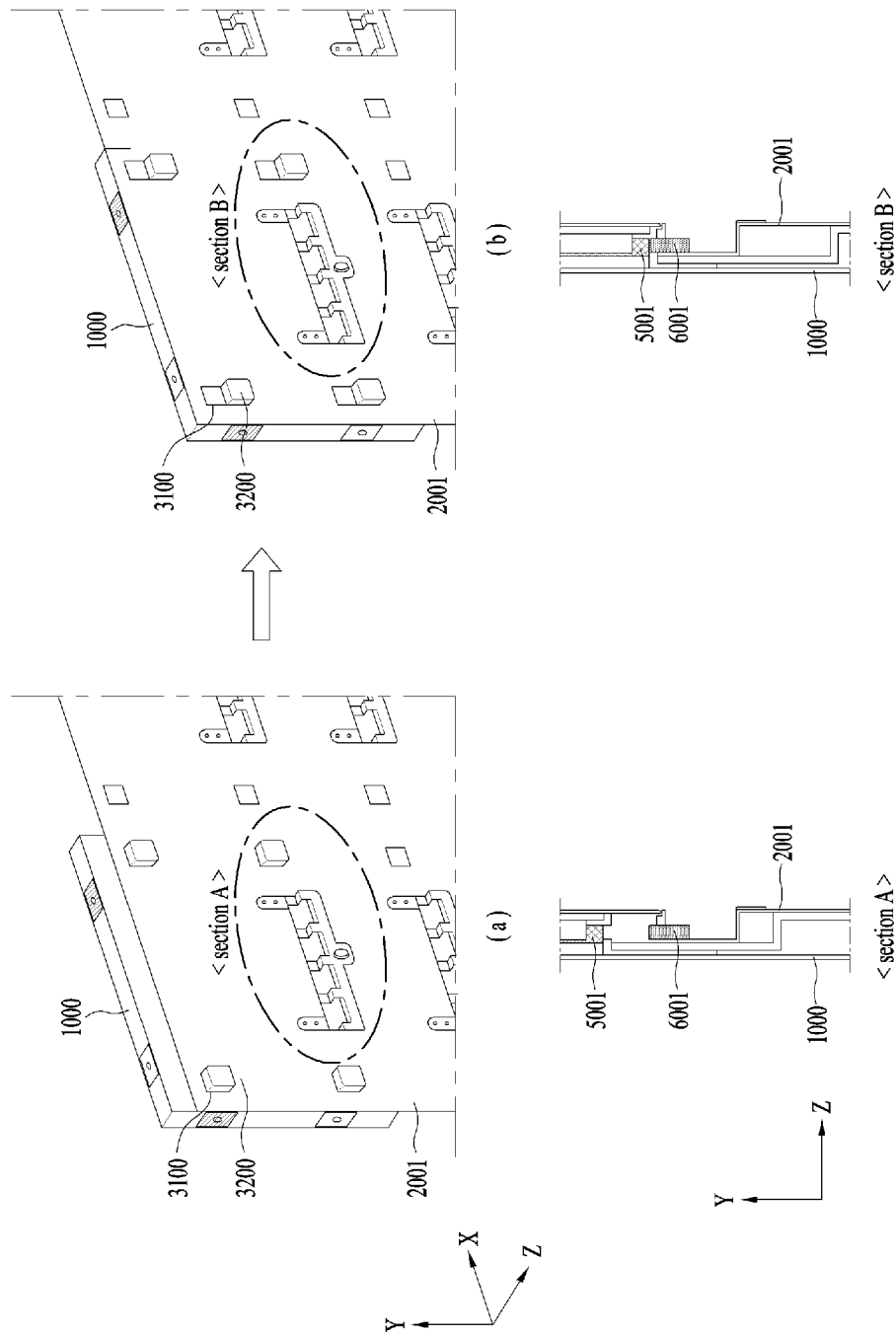
FIG. 18 is a conceptual diagram illustrating a coupling structure of a connector unit of a display device according to an embodiment of the present disclosure.

FIG. 18 is a conceptual view illustrating a coupling structure of a connector unit of the display device according to an embodiment of the present disclosure.

The coupling structure of the existing display module 1000 has a problem in that the connector coupling direction is formed perpendicular to the rear surface of the display module 1000, so that a module-frame coupling structure becomes thick.

According to one embodiment of the present disclosure, since the first connector 6001 is formed in an upward direction and the second connector 5001 is formed in a downward direction, the connectors can be coupled in a direction horizontal to the rear surface of the display module 1000.

More specifically, the user arranges each of the display modules 1000 at an appropriate position on the front surface of the frame 2001 so that the insertion portion 3200 provided on the rear surface of the display module 1000 can be inserted into the accommodation portion 3100 included in the frame 2001. Accordingly, as can be seen from "Section A" in FIG. 18, the second connector 5001 provided on the rear surface of the display module 1000 and the first connector 6001 provided on the front surface of the frame 2001 may be arranged on a common central axis, so that the second connector 5001 and the first connector 6001 can be coupled to each other.

The user moves the display module 1000 in a downward direction so that the insertion portion 3200 is completely inserted into the accommodation portion 3100. As a result, the display module 1000 can be fixed to the frame 2001. In this case, as can be seen from "Section B" in FIG. 18, the first connector 6001 and the second connector 5001 can be coupled to each other on a common central axis by downward movement of the display module 1000. That is, the first connector 6001 and the second connector 5001 may be coupled in a direction parallel to the rear surface of the display module 1000 or the front surface of the frame 2001, so that the overall structure of the display device becomes slimmer.

In one embodiment, the frame 2001 may include a module control circuit that is electrically connected to the first connector 6001 to control the plurality of display modules 1000.

The module control circuit may be provided in an inner space between the frame 2001 and a back cover of the frame 2001.

The module control circuit may be electrically connected to the first connector 6001, and thus can be electrically connected to a module circuit unit that is located inside the plurality of display modules 1000 through the second connector 5001 connected to the first connector 6001.

The module control circuit may control the plurality of display modules 1000 so as to control an image to be displayed on the display panel. Accordingly, the module control circuit can control the plurality of display modules 1000 to output the same image or to output different images. In addition, the module control circuit may control a portion of the entire image to be output to each of the plurality of display modules 1000, so that a large-screen display device can be implemented.

Figure 19:
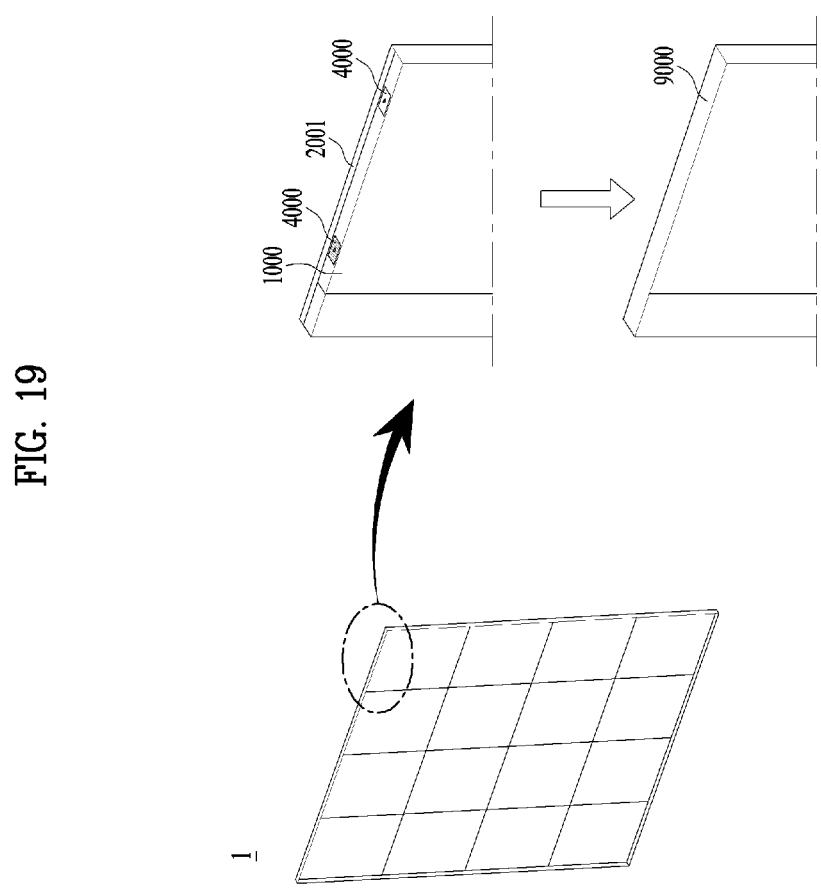
FIG. 19 is a conceptual diagram illustrating a side case coupling structure of a display device according to an embodiment of the present disclosure.

FIG. 19 is a conceptual view illustrating a coupling structure of a side case 9000 of the display device according to an embodiment of the present disclosure.

Referring to FIG. 19, the display device may further include a side case 9000 covering a side surface of the display device. The side case 9000 may be coupled to the second connection member of the display module 1000 by magnetic attraction.

For example, as shown in FIG. 19, the display device according to the present disclosure may be configured with a (4×4) display panel arrangement. The user may configure the display device by sequentially coupling (tiling) the display modules 1000 to the frame 2001. When coupling of the display modules 1000 is completed through the tiling, the upper, lower, left, and right sides of the display device may be finished in a structure in which the second connection member provided on the outermost side surface of the display module 1000 is exposed. The side case 9000 may be formed to cover the side portion of the outermost display module 1000.

More specifically; the side case 9000 may include a magnetic material on the inner surface thereof. Accordingly, the side case 9000 may be coupled to the magnets included in the second connection member by magnetic attraction.

In another embodiment, a magnet having a polarity opposite to that of a magnet included in the second connection member may be provided on the inner surface of the side case 9000 at a portion that is contact with the second connection member. Accordingly, the side case 9000 can be attached to an accurate position on the side of the display panel. In addition, since the side case 9000 is coupled to the display panel by magnetic attraction, the user can easily attach and detach the side case 9000 arbitrarily.

In one embodiment, the side case 9000 may be provided in various shapes. Therefore, the user can configure the display device by selecting the side case 9000 suitable for user taste among the side cases 9000 formed of various colors or materials.

The above description is merely illustrative of the technical spirit of the present disclosure. It will be apparent to those skilled in the art that various modifications and variations can be made in the present disclosure without departing from the spirit and scope of the disclosure.

Therefore, the embodiments disclosed in the present disclosure are merely illustrative of the technical spirit of the present disclosure. The scope of the technical spirit of the present disclosure is not limited by these embodiments.

The scope of the present disclosure should be defined by the appended claims, and all technical ideas within the scope equivalent thereto should be construed as being within the scope of the present disclosure.

As described above, a part or the entirety of features of the present disclosure may be applied to a display device or a manufacturing method thereof.

The invention claimed is:

1. A display device using a semiconductor light emitting element, the display device comprising:
   a display module including the semiconductor light emitting element;
   a frame in which a plurality of the display modules is arranged;
   a first connection member configured to fix the display module onto the frame at a rear surface of the display module, and provide planar fluidity; and
   a second connection member configured to include a magnet provided on a side surface of the display module, and provide attractive force to adjacent the display module,
   wherein the first connection member includes:
   an accommodation portion provided in the frame; and
   an insertion portion provided on a rear surface of the display module, inserted into the accommodation portion to fix the display module, and having a smaller width than the accommodation portion, and
   wherein the insertion portion includes:
   a first structure connected to the rear surface of the display module; and
   a second structure connected vertically to an end of the first structure, and including a protrusion provided on an inner surface thereof facing the rear surface of the display module.

2. The display device according to claim 1, wherein:
   in a state where the insertion portion is inserted into the accommodation portion, the second structure elastically supports the protrusion toward the rear surface of the frame.

3. The display device according to claim 1, wherein:
   the protrusion is continuously formed from an end of the inner surface of the second structure to a portion connected to the first structure; and
   at least one protrusion is provided on the inner surface of the second structure.

4. The display device according to claim 1, wherein the second connection member includes:
   a first magnet provided on a side surface of the display module; and
   a second magnet provided on a side surface of another display module facing the side surface of the display module, and
   wherein the first magnet and the second magnet are formed at positions facing each other.

5. The display device according to claim 4, wherein:
   at least one second connection member is provided on each side surface of the display module.

6. The display device according to claim 5, wherein the second connection member includes:
   a magnet having polarity opposite to that of a magnet included in another second connection member adjacent to the second connection member.

7. The display device according to claim 4, wherein:
   any one of the first magnet and the second magnet includes a magnetic material.

8. The display device according to claim 1, wherein:
   the frame includes:
   a first connector arranged in an upward direction; and
   a first connector guide configured to fix the first connector to the frame,
   the display module includes:
   a second connector arranged in a downward direction so as to be electrically connected to the first connector; and
   a second connector guide configured to fix the second connector to the display module.

9. The display device according to claim 8, wherein:
   at least one of the first connector guide and the second connector guide is elastically supported in an upward or downward direction.

10. The display device according to claim 8, wherein:
    the first connector guide includes:
    at least one guide protrusion formed to protrude upward from a portion that is in contact with the second connector guide, and
    the second connector guide includes:
    at least one guide hole formed to accommodate the guide protrusion therein.

11. The display device according to claim 8, wherein the frame further includes:
    a module control circuit electrically connected to the first connector to control the plurality of the display modules.

12. The display device according to claim 1, further comprising:
    a side case formed to cover a side surface of the display device,
    wherein the side case is coupled to the second connection member of the display module by magnetic attraction.

* * * * *